United States Patent [19]
Nagase et al.

[11] Patent Number: 6,154,808
[45] Date of Patent: Nov. 28, 2000

[54] METHOD AND APPARATUS FOR CONTROLLING DATA ERASE OPERATIONS OF A NON-VOLATILE MEMORY DEVICE

[75] Inventors: Takeshi Nagase; Shinpei Komatsu, both of Yokohama; Yoshihiro Takamatsuya, Kawasaki, all of Japan

[73] Assignee: Fujitsu Limited, Kawasaki, Japan

[21] Appl. No.: 09/081,023

[22] Filed: May 19, 1998

[30] Foreign Application Priority Data

Oct. 31, 1997 [JP] Japan ..................................... 9-300723

[51] Int. Cl.⁷ ..................................................... G06F 12/00
[52] U.S. Cl. ...................... 711/103; 711/166; 365/185.29
[58] Field of Search .................................. 711/103, 154, 711/156, 166; 365/185.29, 185.3, 185.33

[56] References Cited

U.S. PATENT DOCUMENTS

| | | |
|---|---|---|
| 5,223,559 | 6/1993 | Arraudeau et al. ........................ 524/47 |
| 5,524,230 | 6/1996 | Sakaue et al. . |
| 5,933,847 | 8/1999 | Ogawa ..................................... 711/103 |
| 5,991,517 | 11/1999 | Harari et al. ........................ 395/182.01 |
| 5,994,732 | 11/1999 | Ajika et al. .............................. 257/315 |
| 5,999,446 | 12/1999 | Harari et al. ........................ 365/185.03 |

*Primary Examiner*—John W. Cabeca
*Assistant Examiner*—Pierre-Michel Bataille
*Attorney, Agent, or Firm*—Staas & Halsey LLP

[57] ABSTRACT

A semiconductor memory device has a memory space which includes blocks and each of the blocks includes sectors. The sectors have a data storing region and a flag region. Data stored in a sector is marked as valid or erased, depending on the flags in the flag region. If an even number of the flags in the flag region have a logical value of 1, the data is considered to be erased. The data in each sector may be erased and unerased a number of times, by sequentially altering the value of the flags in the flag region. Data stored in the memory may be erased on a sector-by-sector basis.

15 Claims, 5 Drawing Sheets

METHOD AND APPARATUS FOR CONTROLLING DATA ERASE OPERATIONS OF A NON-VOLATILE MEMORY DEVICE

BACKGROUND OF THE INVENTION

The present invention relates to a method and apparatus for controlling a semiconductor memory device, and more particularly, to a method and apparatus for controlling a data erasing operation of a non-volatile semiconductor memory device, such as a flash memory.

As shown in FIG. 1, a conventional flash memory has a plurality of data blocks 2a, 2b, each of which comprises eight sectors, labeled 1a–1h in the block 2a, for storing a data set. In such flash memory, data sets stored in each of the sectors 1a–1h are erased on a per-data-block basis. More specifically, for example, in a case where data sets are written in sectors 1a, 1c, 1d, and 1g within the data block 2a, if there is a desire to erase solely the data set written in sector 1c, there is no alternative but to collectively delete all of the data sets held within the data block 2a.

For this reason, if there is a desire to maintain the data sets written in sectors 1a, 1d, and 1g, all of the data sets stored in the data block 2a must be collectively erased after the data sets stored in sectors 1a, 1d, and 1g have been saved in another data block 2b.

Erasing a data set on a sector-by-sector basis is difficult for the conventional flash memory. For instance, if there is a desire to erase a single data set stored in a desired sector, there arises the need for complicated data transfer processing.

An object of the present invention is to provide a control method and apparatus which erases data in a sector-by-sector manner.

SUMMARY OF THE INVENTION

Briefly stated, the present invention provides a method of controlling a semiconductor memory device which comprises a non-volatile memory section having a plurality of blocks. Each block includes at least one sector. The at least one sector includes a data storing region and a flag region storing a flag. The method includes the step of: initializing the flag in the flag region of a predetermined sector; and writing, in an erase mode, a flag into the flag region of the predetermined sector so that the sector is set to a spuriously-erased state in a sector-by-sector manner.

The present invention provides a semiconductor memory device including a non-volatile memory unit and a control unit. The non-volatile memory unit has a plurality of blocks. Each block includes at least one sector. The at least one sector includes a data storing region and a flag region storing a flag. The control unit writes, in an erase mode, a flag into the flag region of a predetermined sector so that the sector is set to a spuriously-erased state in a sector-by-sector manner.

The present invention provides a controller used in a non-volatile semiconductor memory device having a plurality of blocks. Each block includes at least one sector. The at least one sector includes a data storing region and a flag region storing a flag. The controller operates to initialize the flag in the flag region and write, in an erase mode, a flag into the flag region of a predetermined sector so that the sector is set to a spuriously-erased state in a sector-by-sector manner.

The present invention provides a method of controlling a semiconductor memory device having a memory space which includes blocks. Each of the blocks includes sectors. The sectors has a data storing region and a flag region. The method includes the steps of: writing flags in the flag region to mark data stored in a predetermined sector as valid or erased; determining that the data stored in the predetermined sector is considered to be erased if an even number of the flags in the flag region have a predetermined logical value; and sequentially altering the predetermined value of the flags in the flag region so that the data in the predetermined sector may be erased and valid a number of times.

The present invention provides a semiconductor memory device including a memory space and a control unit. The memory space includes blocks. Each of the blocks includes sectors. The sectors have a data storing region and a flag region. The control unit writes flags in the flag region to mark data stored in a predetermined sector as valid or erased. The control unit determines that the data stored in the predetermined sector is considered to be erased if an even number of the flags in the flag region have a predetermined logical value and sequentially alters the predetermined value of the flags in the flag region so that the data in the predetermined sector may be erased and valid a number of times.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Certain terminology is used in the following description for convenience only and is not limiting. The word "spurious" and its derivatives designate that although data is specified as being erased, in fact, the data has not been erased, but is marked as invalid.

Figure 1:
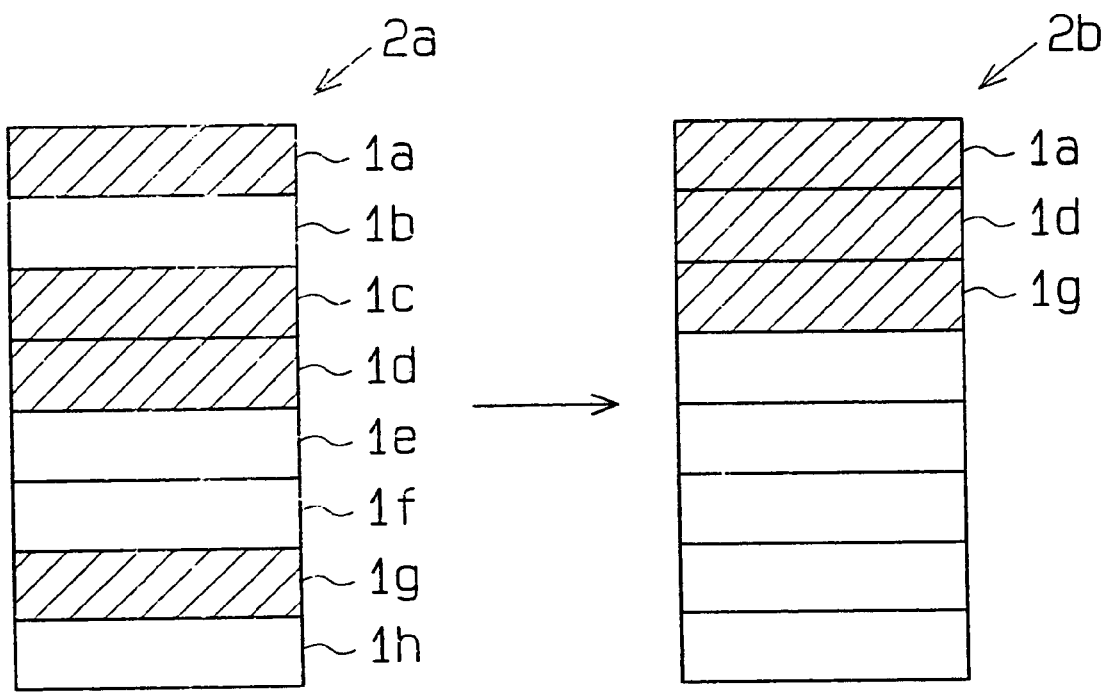
FIG. 1 is a block diagram illustrating an erasing operation of a conventional flash memory.
Figure 2:
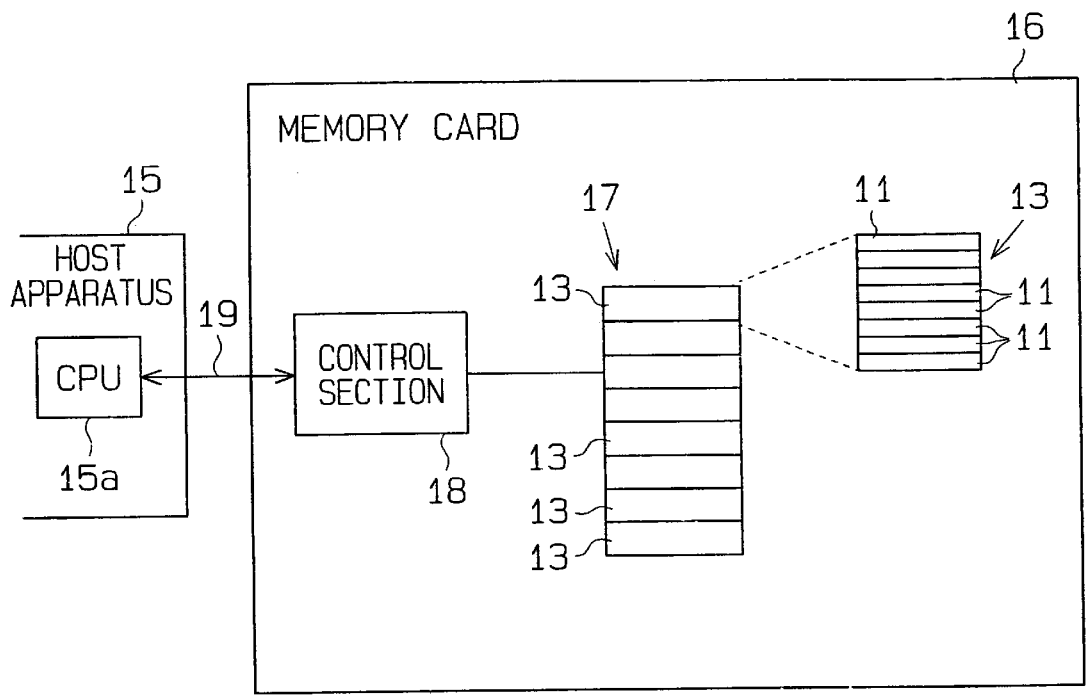
FIG. 2 is a block diagram of a semiconductor memory device in accordance with one embodiment of the present invention.

FIG. 2 shows a system in which the present invention is embodied. In FIG. 2, a host apparatus 15, such as a personal computer or a digital camera, includes a CPU 15a. A memory card 16 functions as an external storage device and is connected to the CPU 15a of the host apparatus 15 by way of a bus 19.

The memory card 16 comprises a storage area 17 formed by flash memory cells. The storage area 17 is divided into a plurality of data blocks 13. Each data block 13 is further divided into a plurality of sectors 11, each of which stores a data set.

The memory card 16 further comprises a control section (i.e., a memory controller) 18. In response to a command received from the CPU 15a, the control section 18 writes data into or reads it from a block 13 or a sector 11 at an address designated by the command. The CPU 15a designates each of the sectors 11 within the storage area 17 using a logical address of the sector 11.

Figure 3:
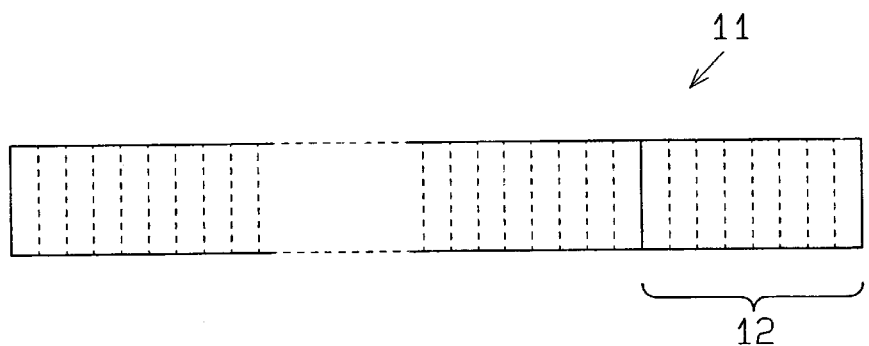
FIG. 3 is a block diagram of a sector of a storage area of the semiconductor memory device of FIG. 2.

FIG. 3 shows one sector 11 of the flash memory. The sector 11 preferably comprises a user data area of 512 bytes and a management data area of 16 bytes. The management data area comprises an erase flag area 12 composed of eight bits. The user data area and the management data area form a data area of 528 bytes.

The validity of each sector 11 is determined or specified by the status of the individual bits of the erase flag area 12. If the number of bits having a value of logical "1" is even, the control section 18 determines that the data of the sector 11 are valid or readable. In contrast, if the number of bits having a logical value "1" is odd, the control section 18 determines that the data of the sector 11 are invalid or unreadable.

The control section 18 performs a data writing operation, a data reading operation, or a data erasing operation for the flash memory in response to the command received from the CPU 15a. More specifically, the control section 18 writes data into the flash memory, and the thus-written data are read by the control section 18. The thus-written data can be erased by the control section 18.

During the data writing operation, the control section 18 writes data into the user data region of an empty sector 11 in response to a write command output from the CPU 15a. Each bit of the empty sector is initially set to "1". The control section 18 performs the writing operation by bringing predetermined bits within the sector into a "0" state.

In a case where the write command output from the CPU 15a represents the updating of data; that is, where the sector 11 in which a data set has already been stored is addressed as a write location, after having identified that the data set has already been stored in the addressed sector (i.e., the number of bits of logical "1" included in the erase flag is even), the control section 18 writes the updated or new data into another empty sector 11. The control section 18 further spuriously erases the data set stored in the addressed sector by rewriting a logical bit "1" to "0" in the erase flag area 12 of the updated data storing sector.

Changing one bit in the erase flag area 12 of the specified sector 11 changes the number of bits specifying a logical "1" form even to odd, thereby indicating that the sector data is invalid.

Figure 4:
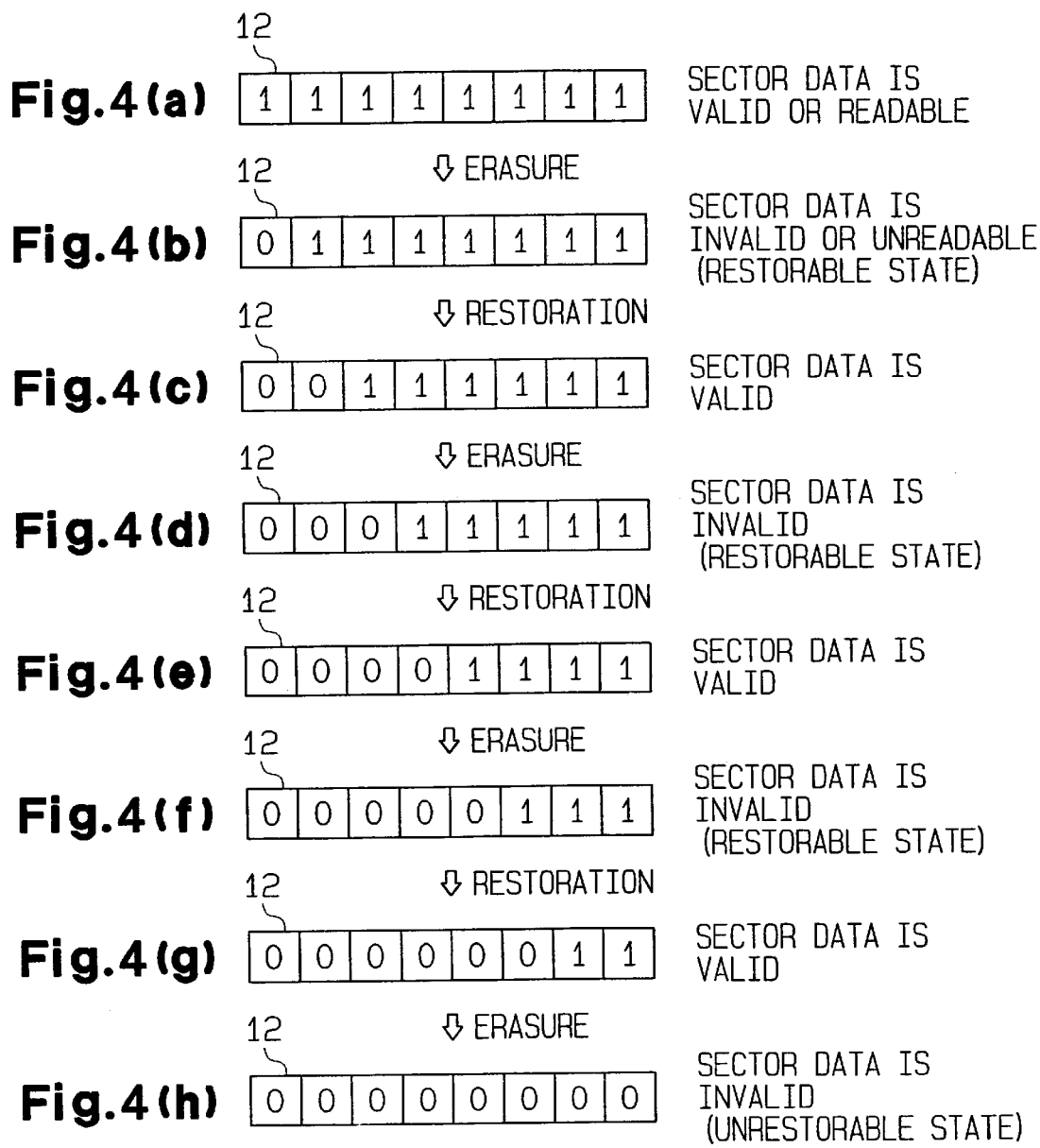
FIGS. 4(a) to 4(h) are block diagram illustrating an erasing operation of the semiconductor memory device of FIG. 2.

As shown in FIG. 4(a), at the outset, a hexadecimal code FFh is written into the erase flag area 12 of each sector 11; i.e., "1" is written into all of the bits of the erase flag area 12. In this state, since the number of bits of logical "1" included in the erase flag area 12 is even, the data stored in this sector 11 are determined to be in a valid or an unerased state at the time of the reading operation and hence are read.

Next, as shown in FIG. 4(b), if one bit of the erase flag area 12 of the sector 11, whose stored data are desired to be set to an erased or valid state, is set to a logical "0", the number of bits of logical "1" included in the erase flag area 12 becomes odd. The data stored in the sector 11 are determined to be in an erased state at the time of a reading operation, and hence the data are not read. As in the case of an empty sector, data of all "1" are read from the sector.

If there is a desire to restore the data stored in the sector 11 which is in an erased state, as shown in FIG. 4(c) one bit of logical "1" included in the erase flag area 12 is set to a logical "0", so that the number of logical "1" included in the erase flag area 12 becomes even and the data stored in the sector 11 are determined to be in an unerased state. In short, the data stored in the sector 11 are restored to the unerased state from the erased state.

Sequentially rewriting a logical "0" into the bits of logical "1" included in the erase flag area 12 allows the data stored in the sector 11 to be alternately switched up to three times between a valid state and an invalid state.

As shown in FIG. 4(h), in a case where all of the bits of the erase flag area 12 are set to a logical "0" (i.e., the contents of the erase flag area 12 becomes "00h"), the data stored in the sector 11 are determined to be in an erased state.

According to the present invention, a plurality of sectors 11 may be substantially simultaneously set to an erased state. The sectors 11 to be simultaneously set to an erased state may extend over a plurality of blocks.

Figure 5:
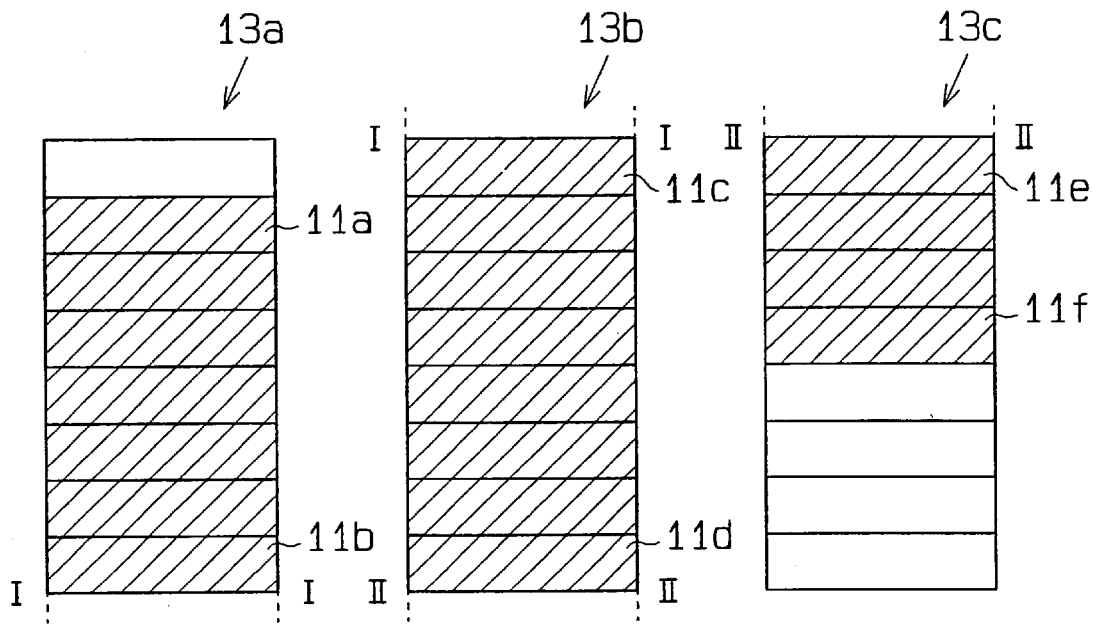
FIG. 5 is a block diagram illustrating an erasing operation performed across a plurality of data blocks in a sector-by-sector manner.

FIG. 5 shows a case where a contiguous sequence of nineteen (19) sectors spanning three blocks 13a to 13c, each of which comprises eight sectors, are erased. Blocks 13a, 13b are contiguous to each other via boundary I—I, and blocks 13b, 13c are contiguous to each other via boundary II—II.

It is assumed that the control section 18 has received from the CPU 15a an erase request for bringing into an erased state the data stored in the contiguous sequence of 19 sectors, starting with the second sector 11a of the block 13a. In this case, the control section 18 spuriously erases the data in the seven sectors 11a to 11b of the block 13a by making odd the number of bits of logical "1" included in each erase flag area 12 belonging to the sectors 11a to 11b.

The data stored in eight sectors of the block 13b are spuriously erased, also by making odd the number of bits of logical "1" in its erase flag area, and the data stored in the remaining four (4) sectors of block 13c must be erased.

Since the data stored in the remaining four sectors must be erased, the block 13c is subjected to an erasing operation. The data stored in a sequence of sectors of the block 13c, starting with the first sector 1e and ending with the fourth sector 11f, are spuriously erased in a manner analogous to that mentioned previously. Through the foregoing operations, an arbitrary number of data sets stored in sectors 11 are spuriously erased across a plurality of blocks 13.

Figure 6:
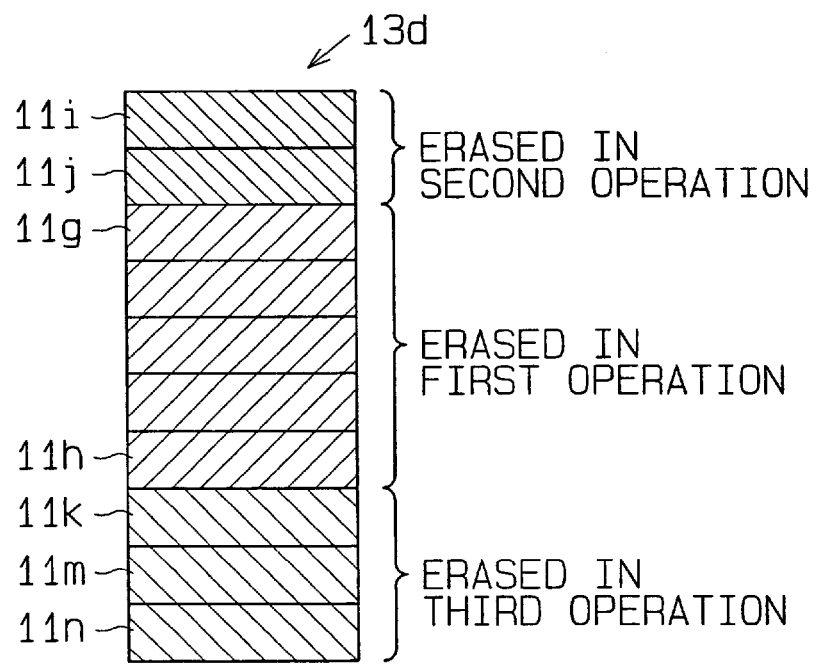
FIG. 6 is a block diagram illustrating an erasing operation performed on one data block in a sector-by-sector manner.

FIG. 6 shows a case where the data stored in the sectors 11 of one block 13d are spuriously erased several times. For example, in the first spurious erasing operation, the data stored in a sequence of sectors, starting with the third sector 11g and ending with the seventh sector 11h, are spuriously erased. The remaining sectors within the block 13d are in an unerased state and are thus readable.

In the second spurious erasing operation, the data stored in the first and second sectors 11i and 11j are spuriously erased, and the remaining sectors 11k, 11m, and 11n are set to an unerased state, thus rendering the data stored in the remaining sectors readable.

In the third spurious erasing operation, the data stored in the remaining sectors 11k, 11m, and 11n are spuriously erased, thereby spuriously erasing all of the sectors within the block 13d. As a result, the data stored in the block 13d are set to an unreadable state. Alternatively, the data sets stored in arbitrary sectors within the block 13d may be restored to an unerased state by rewriting an erase flag in a respective erase flag area 12 belonging to each of the sectors 11.

Since new data cannot be written into the block 13d when all of the sectors 11 are set to a spuriously-erased state, if the spuriously-erased data sets are unnecessary, new data can be stored in the corresponding sectors of the blocks 13d by performing a block erase operation in lieu of the third spurious erasing operation.

If all of the sectors 11 within the block 13d are in an unrestorable state (i.e., all of the bits of the erase flag area 12 belonging to each of the sectors are "0"), the control section 18 identifies the state and performs a block erase operation.

Figure 7:
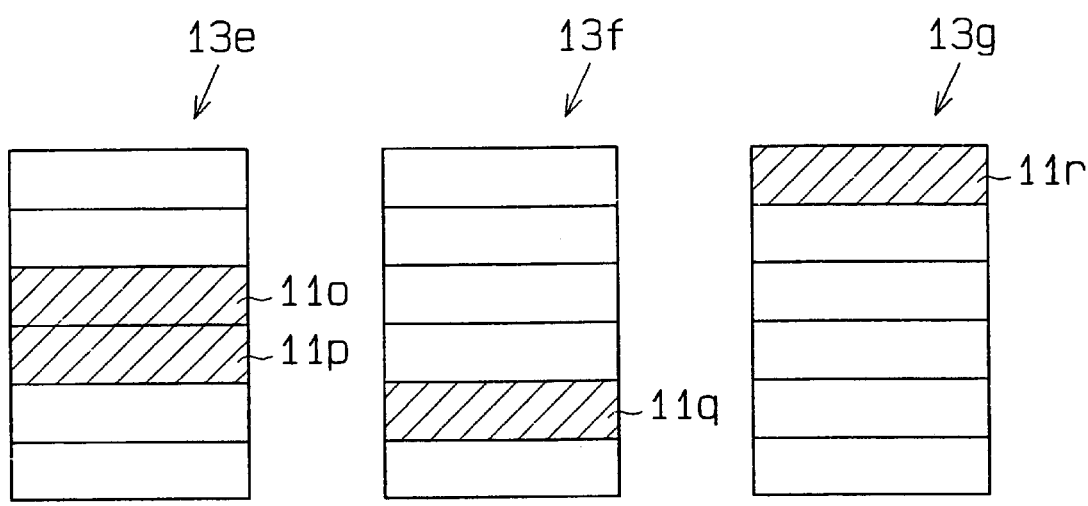
FIG. 7 is a schematic block diagram showing an erasing operation in accordance with the present invention performed on a plurality of data blocks in a sector-by-sector manner.

FIG. 7 shows a case where arbitrary sectors within an arbitrary number of blocks 13e to 13g are spuriously erased. Upon receipt of an erase request from the CPU 15a for erasing the data stored in sectors 11o and 11p of a block 13e, in a sector 11q of a block 13f, and in a sector 11r of a block 13g, the control section 18 spuriously erases the data in an arbitrary sequence.

In this way, the data stored in a contiguous or uncontiguous sequence of sectors within the arbitrary blocks 13e to 13g are spuriously erased. It is possible to read the data stored in the sectors within the blocks 13e to 13g that are not subjected to a spurious erasing operation.

The flash memory in accordance with one embodiment of the present invention has the following advantages:

(1) The bits of the erase flag area 12 are set in each sector 11, and the data stored in the sector 11 is set to a spuriously-erased state, or an unreadable state, on the basis of the settings of the erase flags. Accordingly, either an unerased state or a spuriously-erased state is set for each arbitrary sector;

(2) The number of bits contained in the erase flag area 12 is preferably set to eight. When the number of bits of logical "1" included in the erase flag area 12 is even, the sector corresponding to this erase flag area 12 is set to an unerased state. In contrast, when the number of bits of logical "1" is odd, the corresponding sector is set to a spuriously-erased state. So long as the bits of the erase flag area 12 is rewritten from an "FFh" state into a logical "0" in a one by one manner, the sector can be restored to the unerased state from the spuriously-erased state up to three times;

(3) So long as the number of bits included in the erase flag area 12 is set to a suitable even number other than eight bits, the number of times the sector is restored to the unerased state from the spuriously-erased state can be set, as required;

(4) A contiguous sequence of an arbitrary number of sectors can be set to a spuriously-erased state across a plurality of blocks;

(5) An arbitrary number of sectors within an identical block may be set to an unerased state from a spuriously-erased state, and vice verse, a plurality of times; and (6) An arbitrary number of sectors within an arbitrary number of different blocks may be set to a spuriously-erased state.

It should be apparent to those skilled in the art that the present invention may be embodied in many other specific forms without departing from the spirit or scope of the invention. For example, the present invention may be adapted to a non-volatile semiconductor memory device including the CPU, the control section and the memory section. Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
   a non-volatile memory unit having a plurality of blocks, each block including at least one sector, the at least one sector including a data storing region and a multi-bit flag region for storing a flag; and
   a control unit for writing, in an erase mode, a first bit of the flag region of a predetermined sector so that the sector is set to a spuriously-erased state in a sector-by-sector manner, wherein the spuriously erased state is designated based on the number of bits in the flag region having a first logical value, and writing, in a restore mode, a next bit of the flag region of the predetermined sector so that the sector is set to a restored state based on the number of bits in the flag region having the first logical value.

2. The semiconductor memory device according to claim 1, wherein the first logical value is 1 and the control unit determines that the predetermined sector has the spuriously-erased state when the number of bits of the logical value 1 is even.

3. The semiconductor memory device according to claim 1, wherein the control unit writes the flag into the flag region by sequentially inverting each bit of the first logical value or a second logical value in a one by one manner so that the sector is alternately set to the spuriously-erased state or an unerased state.

4. A semiconductor memory device comprising:
   a memory space which includes blocks, each of the blocks including sectors, the sectors having a data storing region and a multi-bit flag region; and
   a control unit for writing flags in the flag region to mark data stored in a predetermined sector as valid or erased, wherein the control unit determines that the data stored in the predetermined sector is considered to be erased if an even number of the flags in the flag region have a predetermined logical value and sequentially alters the predetermined logical value of the flags in the flag region so that the data in the predetermined sector may be alternately erased and valid a number of times.

5. The semiconductor memory device according to claim 4, wherein the predetermined logical value is 1.

6. A controller used in a semiconductor memory device having a plurality of blocks, each block including at least one sector, that at least one sector including a data storing region and a multi-bit flag region for storing a flag, the controller operating to:
   initialize the multi-bit flag in the flag region of a predetermined sector;
   write, in an erase mode, a first bit of the flag region of the predetermined sector so that the sector is set to a spuriously-erased state in a sector-by-sector manner, wherein the spuriously-erased state is designated based on the number of bits in the flag region having a first logical value; and
   write, in a restore mode, a next bit of the flag region of the predetermined sector so that the sector is set to a restored state based on the number of bits in the flag region having the first logical value.

7. The controller according to claim 6, wherein the first logical value is 1 and the controller operates to determine that the sector has the spuriously-erased state when the number of bits of the logical value 1 is even.

8. The controller according to claim 6, wherein the controller operates to write the flag into the flag region by sequentially inverting each bit of the first logical value or the a second logical value in a one by one manner so that the sector is alternately set to the spuriously-erased state or an unerased state.

9. A method of controlling a semiconductor memory device which comprises a non-volatile memory section having a plurality of blocks, each block including at least one sector, the at least one sector including a data storing region and a multi-bit flag region for storing a flag, the method comprising the steps of:

initializing the multi-bit flag in the flag region of a predetermined sector;

writing, in an erase mode, a first bit of the flag region of the predetermined sector so that the sector is set to a spuriously-erased state in a sector-by-sector manner, wherein the spuriously erased state is designated based on the number of bits in the flag region having a first logical value; and writing, in a restore mode, a next bit of the flag region of the predetermined sector so that the sector is set to a restored state based on the number of bits in the flag region having the first logical value.

10. The method according to claim 9, wherein the first logical value is 1 and the spuriously-erased state is determined when the number of bits of the logical value 1 is even.

11. The method according to claim 9, wherein the flag is written into the flag region by sequentially inverting each bit of the first logical value or a second logical value in a one by one manner so that the sector is alternately set to the spuriously-erased state or an unerased state.

12. The method according to claim 9, wherein for a plurality of sectors, the corresponding flags are written into the flag regions of a contiguous sequence of the sectors across at least a two block sequence.

13. The method according to claim 9 further comprising the step of erasing one block when all of the sectors in the one block are set to a spuriously-erased state.

14. A method of controlling a semiconductor memory device having a memory space which includes blocks, each block including sectors, the sectors having a data storing region and a multi-bit flag region for storing a flag, the method comprising the steps of:

writing flags in the multi-bit flag region to mark data stored in a predetermined sector as valid or erased;

determining that the data stored in the predetermined sector is considered to be erased is an even number of the flags in the flag region have a predetermined logical value; and sequentially altering the predetermined value of the flags in the multi-bit flag region so that the data in the predetermined sector is alternately erased and valid a number of times.

15. The method according to claim 14, wherein the predetermined logical value is 1.

* * * * *